United States Patent
Van Der Schaar et al.

(10) Patent No.: US 12,019,377 B2
(45) Date of Patent: Jun. 25, 2024

(54) TARGET FOR MEASURING A PARAMETER OF A LITHOGRAPHIC PROCESS

(71) Applicant: ASML Netherlands B.V., Veldhoven (NL)

(72) Inventors: Maurits Van Der Schaar, Eindhoven (NL); Olger Victor Zwier, Eindhoven (NL); Patrick Warnaar, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 44 days.

(21) Appl. No.: 17/299,531

(22) PCT Filed: Dec. 4, 2019

(86) PCT No.: PCT/EP2019/083666
§ 371 (c)(1),
(2) Date: Jun. 3, 2021

(87) PCT Pub. No.: WO2020/115125
PCT Pub. Date: Jun. 11, 2020

(65) Prior Publication Data
US 2022/0035255 A1    Feb. 3, 2022

Related U.S. Application Data

(60) Provisional application No. 62/775,295, filed on Dec. 4, 2018.

(51) Int. Cl.
*G03F 7/00*    (2006.01)
*G01N 21/47*    (2006.01)

(52) U.S. Cl.
CPC ..... *G03F 7/70633* (2013.01); *G01N 21/4788* (2013.01); *G03F 7/70683* (2013.01)

(58) Field of Classification Search
CPC ............ G01N 21/4788; G03F 7/70616; G03F 7/70625; G03F 7/70633; G03F 7/70641;
(Continued)

(56) References Cited

U.S. PATENT DOCUMENTS

| 6,982,793 B1 * | 1/2006 | Yang | ................... G03F 7/70633 356/401 |
| 7,046,361 B1 * | 5/2006 | Yang | ................... G03F 7/70633 356/401 |

(Continued)

FOREIGN PATENT DOCUMENTS

| KR | 2014-0096331 A | 8/2014 |
| TW | 201232060 A | 8/2012 |

(Continued)

OTHER PUBLICATIONS

International Search Report and Written Opinion of the International Searching Authority directed to related International Patent Application No. PCT/EP2019/083666, mailed Mar. 6, 2020; 8 pages.

(Continued)

*Primary Examiner* — Gordon J Stock, Jr.
(74) *Attorney, Agent, or Firm* — Sterne, Kessler, Goldstein & Fox P.L.L.C.

(57) ABSTRACT

A target for determining a performance parameter of a lithographic process, the target comprising a first sub-target formed by at least two overlapping gratings, wherein the underlying grating of the first sub-target has a first pitch and the top lying grating of the first sub-target has a second pitch, at least a second sub-target formed by at least two overlapping gratings, wherein the underlying grating of the second sub-target has a third pitch and the top lying grating of the second sub-target has a fourth pitch.

16 Claims, 4 Drawing Sheets

(58) Field of Classification Search
CPC ... G03F 7/7065; G03F 7/70683; G01B 11/02; G01B 11/022; G01B 11/024; G01B 11/14
See application file for complete search history.

(56) References Cited

U.S. PATENT DOCUMENTS

| | | | |
|---|---|---|---|
| 7,440,105 B2* | 10/2008 | Adel | H01L 22/12 257/797 |
| 9,709,903 B2 | 7/2017 | Choi et al. | |
| 9,846,359 B1* | 12/2017 | Oh | G03F 7/70683 |
| 9,939,742 B2 | 4/2018 | Tinnemans et al. | |
| 10,527,952 B2* | 1/2020 | Grunzweig | G03F 7/70683 |
| 10,606,178 B2* | 3/2020 | Zwier | G03F 7/7065 |
| 10,802,409 B2* | 10/2020 | Fan | G03F 7/70633 |
| 11,119,419 B2* | 9/2021 | Ghinovker | H01L 22/12 |
| 11,243,475 B2* | 2/2022 | Chen | G03F 7/70633 |
| 11,385,553 B2* | 7/2022 | Zhou | G03F 7/7085 |
| 11,675,277 B2* | 6/2023 | Yang | G03F 9/7049 356/508 |
| 2010/0201963 A1 | 8/2010 | Cramer et al. | |
| 2011/0027704 A1 | 2/2011 | Cramer et al. | |
| 2011/0043791 A1 | 2/2011 | Smilde et al. | |
| 2011/0102753 A1 | 5/2011 | Van De Kerkhof et al. | |
| 2012/0044470 A1* | 2/2012 | Smilde | G03F 7/70633 355/72 |
| 2012/0242970 A1 | 9/2012 | Smilde et al. | |
| 2016/0061589 A1* | 3/2016 | Bhattacharyya | G03F 7/70683 356/620 |
| 2017/0090302 A1* | 3/2017 | Slotboom | G03F 7/70633 |
| 2017/0293233 A1 | 10/2017 | Van Der Schaar et al. | |
| 2018/0024054 A1 | 1/2018 | Moon et al. | |
| 2018/0321599 A1* | 11/2018 | Bozkurt | G03F 7/7085 |
| 2019/0155173 A1* | 5/2019 | Tsiatmas | G06T 7/0006 |

FOREIGN PATENT DOCUMENTS

| | | |
|---|---|---|
| TW | 201423286 A | 6/2014 |
| WO | WO 2009/078708 A1 | 6/2009 |
| WO | WO 2009/106279 A1 | 9/2009 |
| WO | WO 2017/111925 A1 | 6/2017 |

OTHER PUBLICATIONS

International Preliminary Report on Patentability directed to related International Patent Application No. PCT/EP2019/083666, issued Jun. 8, 2021.
Notice to Submit a Response directed to Korean Patent Application No. 10-2021-7018368, mailed Aug. 22, 2023; 6 pages.

* cited by examiner

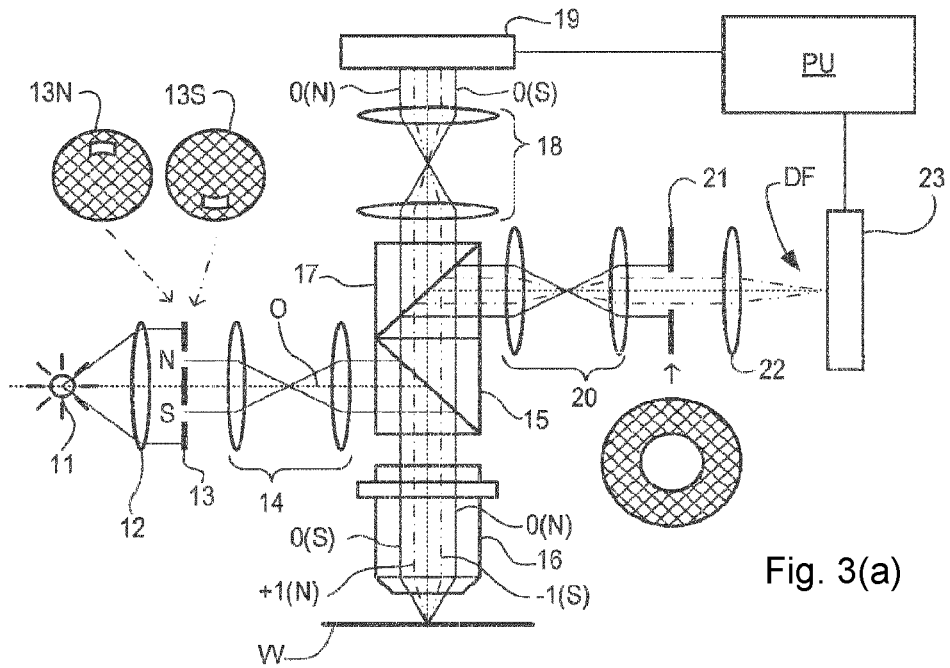
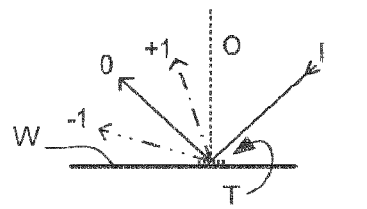
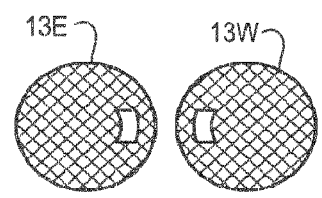
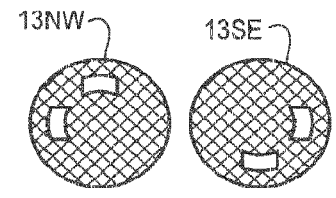
Fig. 3(b)   Fig. 3(c)   Fig. 3(d)
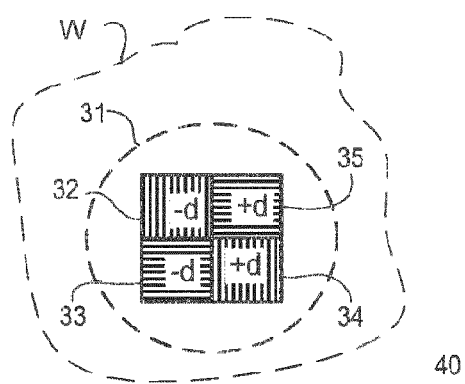
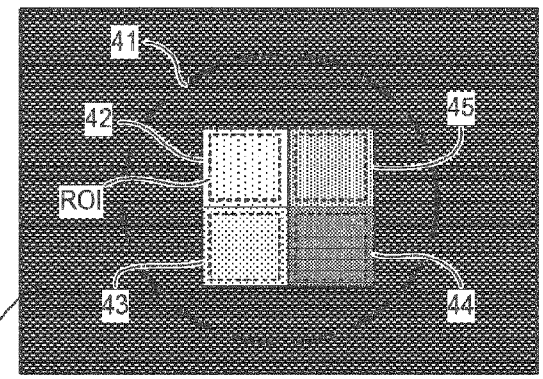
Fig. 4 (Prior art)   Fig. 5 (Prior art)

TARGET FOR MEASURING A PARAMETER OF A LITHOGRAPHIC PROCESS

CROSS-REFERENCE TO RELATED APPLICATIONS

This application claims priority of U.S. application 62/775,295 which was filed on Dec. 4, 2018 and which is incorporated herein in its entirety by reference.

BACKGROUND

Field of the Invention

The present invention relates to methods and apparatus for metrology usable, for example, in the manufacture of devices by lithographic techniques and to methods of manufacturing devices using lithographic techniques. The invention further relates to patterning devices and computer program products usable in such methods.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. Modifications of the apparatus to improve throughput are described in US2010201963A1 and US2011102753A1. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring an overlay target twice under certain conditions, while either rotating the overlay target or changing the illumination mode or imaging mode to obtain separately the $-1^{st}$ and the $+1^{st}$ diffraction order intensities. The intensity asymmetry, a comparison of these diffraction order intensities, for a given overlay target provides a measurement of asymmetry in the target. This asymmetry in the overlay target can be used as an indicator of overlay (undesired misalignment of two layers).

In the known method using four distinct sub-targets, a certain portion of the patterned area is not usable due to edge effects. In semiconductor product designs the efficient use of space is very important. The use of only two specific offsets enforces the above assumption of linearity, which may lead to inaccuracy when the true relationship is non-linear. To increase the number of offsets in the known designs used would increase the space used.

SUMMARY OF THE INVENTION

It would be desirable to be able to perform metrology of overlay or other performance parameters with increased accuracy, and/or with less space used for the targets.

The invention in a first aspect provides a target for determining a performance parameter of a lithographic process, the target comprising a first sub-target formed by at least two overlapping gratings, wherein the underlying grating of the first sub-target has a first pitch and the top lying grating of the first sub-target has a second pitch, at least a second sub-target formed by at least two overlapping gratings, wherein the underlying grating of the second sub-target has a third pitch and the top lying grating of the second sub-target has a fourth pitch.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIGS. 3(a)-3(b) comprise 3(a) a schematic diagram of a dark field scatterometer for use in measuring targets using a first pair of illumination apertures, 3(b) a detail of diffraction spectrum of a target grating for a given direction of illumination 3(c) a second pair of illumination apertures providing further illumination modes in using the scatterometer for diffraction based overlay measurements and 3(d) a third pair of illumination apertures combining the first and second pair of apertures;

FIG. 4 depicts a known form of multiple grating target and an outline of a measurement spot on a substrate;

FIG. 5 depicts an image of the target of FIG. 4 obtained in the scatterometer of FIGS. 3(a)-3(b);

DETAILED DESCRIPTION OF EXEMPLARY EMBODIMENTS

Before describing embodiments of the invention in detail, it is instructive to present an example environment in which embodiments of the present invention may be implemented.

Figure 1:
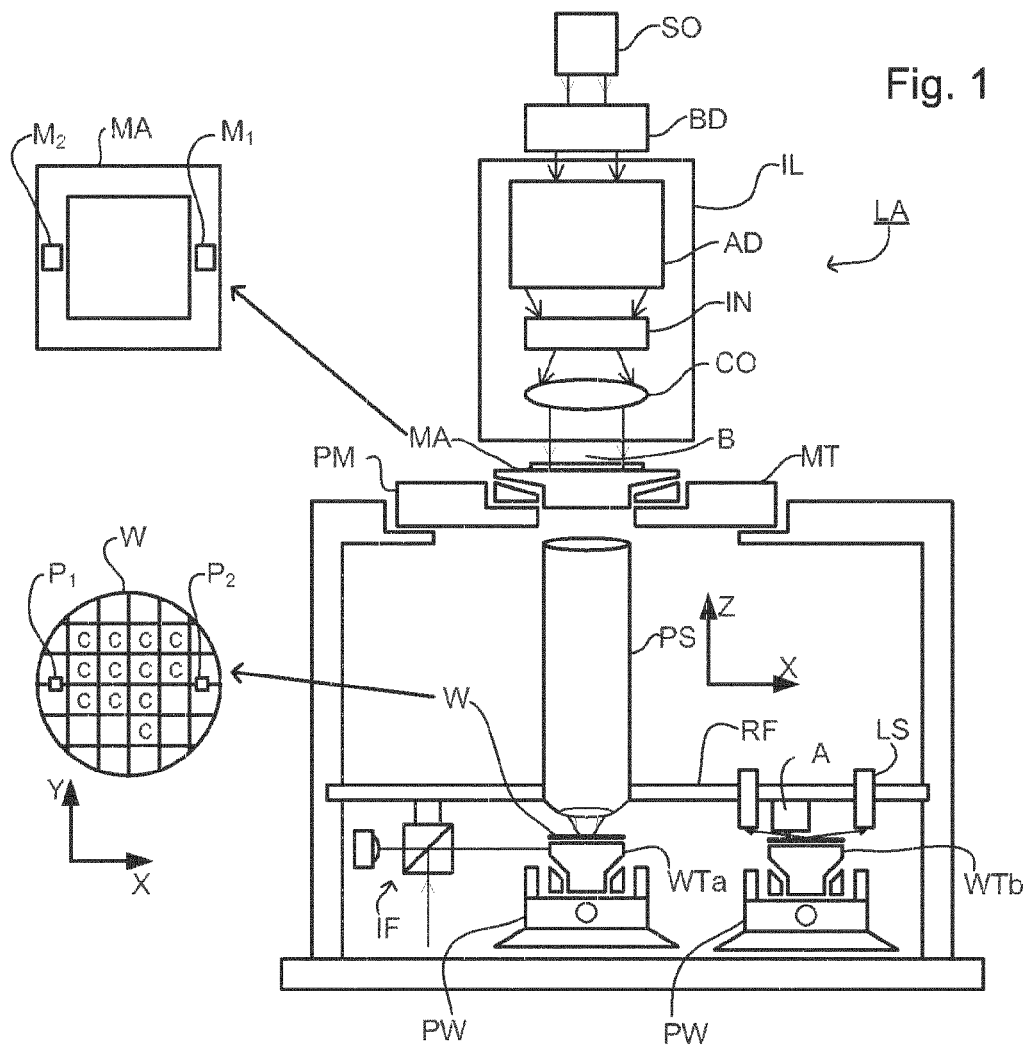
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical or non-optical components, such as refractive, reflective, magnetic, electromagnetic, electrostatic or other types of components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
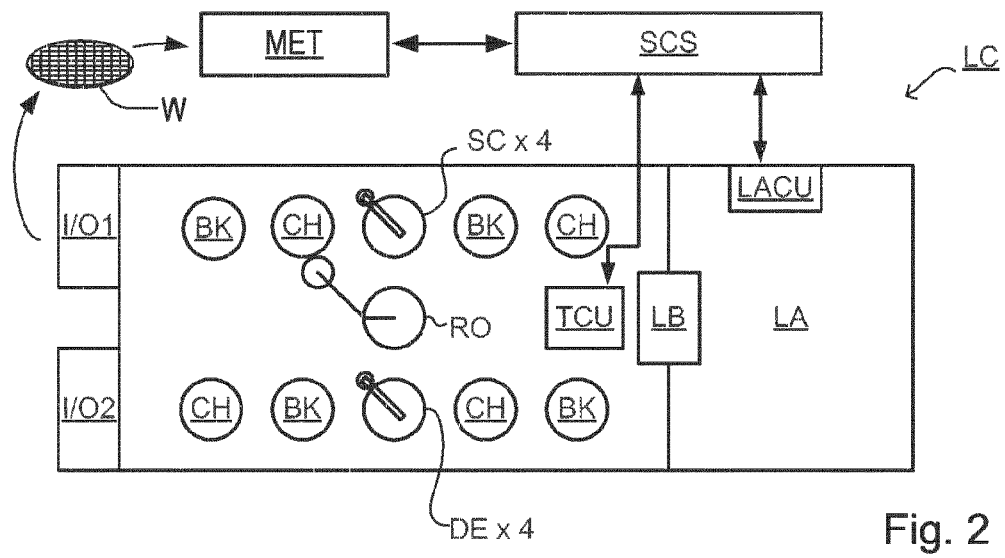
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatuses have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

A metrology apparatus is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus depicted here is purely exemplary, to provide an explanation of dark field metrology. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In other examples, a two quadrant aperture may be used. This may enable simultaneous detection of plus and minus orders, as described in US2010201963A1, mentioned above. Embodiments with optical wedges (segmented prisms or other suitable elements) in the detection branch can be used to separate the orders for imaging spatially in a single image, as described in US2011102753A1, mentioned above. In yet other embodiments, $2^{nd}$, $3^{rd}$ and higher order beams (not shown in FIG. 3) can be used in measurements, instead of or in addition to the first order beams. In yet other embodiments, a segmented prism can be used in place of aperture stop 21, enabling both +1 and −1 orders to be captured simultaneously at spatially separate locations on image sensor 23.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

FIG. 4 depicts an overlay target or composite overlay target formed on a substrate according to known practice. The overlay target in this example comprises four sub-targets (e.g., gratings) 32 to 35 positioned closely together so that they will all be within a measurement spot 31 formed by the metrology radiation illumination beam of the metrology apparatus. The four sub-overlay targets thus are all simultaneously illuminated and simultaneously imaged on sensor 23. In an example dedicated to measurement of overlay, sub-targets 32 to 35 are themselves composite structures formed by overlying gratings that are patterned in different layers of the semi-conductor device formed on substrate W. Sub-targets 32 to 35 may have differently biased overlay offsets in order to facilitate measurement of overlay between the layers in which the different parts of the composite sub-targets are formed. The meaning of overlay bias will be explained below with reference to FIG. 7. Sub-targets 32 to 35 may also differ in their orientation, as shown, so as to diffract incoming radiation in X and Y directions. In one example, sub-targets 32 and 34 are X-direction sub-targets with biases of the +d, −d, respectively. Sub-targets 33 and 35 are Y-direction sub-targets with offsets +d and −d respectively. Separate images of these sub-targets can be identified in the image captured by sensor 23. This is only one example of an overlay target. An overlay target may comprise more or fewer than 4 sub-targets.

FIG. 5 shows an example of an image that may be formed on and detected by the sensor 23, using the overlay target of FIG. 4 in the apparatus of FIG. 3, using the aperture plates 13NW or 13SE from FIG. 3(d). While the pupil plane image sensor 19 cannot resolve the different individual sub-targets 32 to 35, the image sensor 23 can do so. The hatched area 40 represents the field of the image on the sensor, within which the illuminated spot 31 on the substrate is imaged into a corresponding circular area 41. Within this, rectangular areas 42-45 represent the images of the small overlay target sub-targets 32 to 35. If the overlay targets are located in product areas, product features may also be visible in the periphery of this image field. Image processor and controller PU processes these images using pattern recognition to identify the separate images 42 to 45 of sub-targets 32 to 35. In this way, the images do not have to be aligned very precisely at a specific location within the sensor frame, which greatly improves throughput of the measuring apparatus as a whole.

Once the separate images of the overlay targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Using for example the method described in applications such as US20110027704A, mentioned above, overlay error (i.e., undesired and unintentional overlay misalignment) between the two layers within the sub-targets 32 to 35 is measured. Such a method may be referred to as micro diffraction based overlay (μDBO). This measurement is done through overlay target asymmetry, as revealed by comparing their intensities in the +1 order and −1 order dark field images (the intensities of other corresponding higher orders can be compared, e.g. +2 and −2 orders) to obtain a measure of the intensity asymmetry.

In a known method using a multi-grating target such as that illustrated in FIG. 4, with overlay OV can be determined via the following equation:

$$OV = \frac{p}{2\pi}\tan^{-1}\left(\tan\left(\frac{2\pi d}{p}\right)\left(\frac{(I_{+d}^{+1} - I_{+d}^{-1}) + (I_{-d}^{+1} - I_{-d}^{-1})}{(I_{+d}^{+1} - I_{+d}^{-1}) - (I_{-d}^{+1} - I_{-d}^{-1})}\right)\right) \quad \text{(Equation 1)}$$

$$\cong d\frac{A_{+d} + A_{+d}}{A_{+d} - A_{-d}}$$

where:
$I_{+d}^{+1}$ is the +1$^{st}$ diffraction order from positive bias target (e.g., intensity value);
$I_{+d}^{-1}$ is the −1$^{st}$ diffraction order from positive bias target;
$I_{-d}^{+1}$ is the +1$^{st}$ diffraction order from negative bias target;
$I_{-d}^{-1}$ is the −1$^{st}$ diffraction order from negative bias target;
$A_{+d} = I_{+d}^{+1} - I_{+d}^{-1}$; (e.g., asymmetry in the +1$^{st}$ and −1$^{st}$ intensities from positive bias target); and
$A_{-d} = I_{-d}^{+1} - I_{-d}^{-1}$, (e.g., asymmetry in the +1$^{st}$ and −1$^{st}$ intensities from negative bias target).

Equation 1 can be reformulated in terms of a sensitivity coefficient K which is a stack dependent parameter having the special property of being overlay independent (assuming a perfect target):

$$A_{+d} + A_{-d} = K \cdot OV \quad \text{(Equation 2)}$$

where:

$$K = \frac{A_{+d} - A_{-d}}{d} \quad \text{(Equation 3)}$$

While Equation 2 is a simple linear equation, based on an assumption of small bias values and overlay errors, compared with a pitch of the gratings that form the sub-targets, the dependence of asymmetry on overlay error and bias over a wider range, has a substantially sinusoidal form. A sinusoidal model can also be used, instead of the linear model of Equation 2.

The known method using four distinct sub-targets requires borders around each sub-target (not shown in FIGS. 4 and 5) to make them distinctive in the image 40. This means that a certain portion of the patterned area is not usable due to edge effects. Additionally, the use of only two specific offsets enforces the above assumption of linearity, which may lead to inaccuracy when the true relationship is non-linear.

In the following, we disclose solutions including overlay targets with continuous variation of bias, and/or multiple bias values. When applied in the image plane overlay measurement techniques just described, the multiple bias values can be seen in an intensity image over the target area. Verification of linearity and/or sinusoidal fitting can be performed to ensure that quality information is being used. Additionally, more information about the sensitivity of the target and the measurement apparatus to overlay and other factors can be obtained. Embodiments will be illustrated based on rotation or staggering of one or both gratings forming an overlay grating. Embodiments will be illustrated based on different pitches of top and bottom gratings. With appropriate design, more of the current area can be used in the signal determination. Target size may be reduced, and/or measurement accuracy increased, compared with the current technique.

Figure 6:
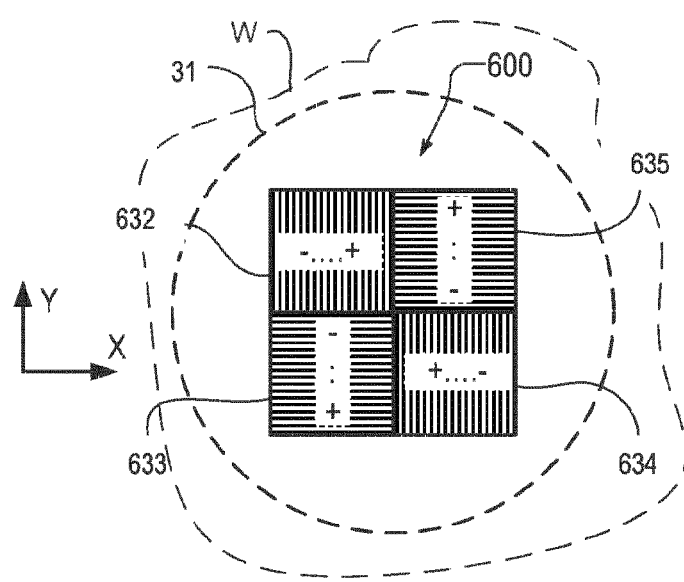
FIG. 6 depicts a first example of a multiple grating target including continuous bias features according to an aspect of the present disclosure.

FIG. 6 shows a multi-grating target 600, comprising individual sub-targets 632 to 635. As in the target of FIG. 4, the four sub-targets comprise two overlay gratings for measurement in the X direction and two overlay gratings for measurement in the Y direction. Instead of providing a fixed overlay bias within each grating, however, a multi-step or continuous variation of bias including negative values, positive values and intermediate values is provided. Gratings 632 and 635 have bias values increasing with X and Y respectively. Conversely, gratings 633 and 634 have bias values decreasing with X and Y respectively. It is a matter of design choice, whether the target 600 and the individual sub-targets have the same dimensions as a known target, or are made larger or smaller.

Figure 7:
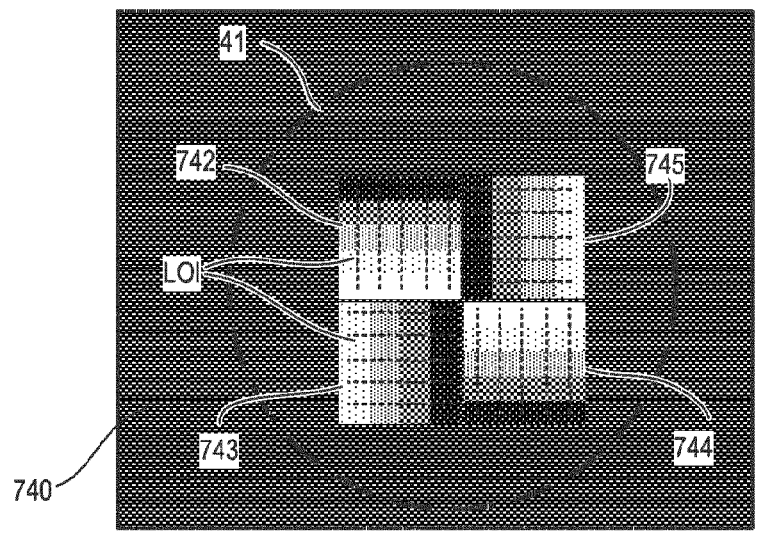
FIG. 7 depicts an image of the target of FIG. 6 obtained in the scatterometer of FIGS. 3(a)-3(b)

FIG. 7 shows schematically the corresponding image 740 captured on sensor 23 in the apparatus of FIG. 3. Reference signs 742 to 745 indicate the intensity image regions corresponding to the individual sub-targets. Due to the variation of bias over each sub-target, the intensity varies, rather than being constant within each region. Instead of regions of interest ROI, one can imagine "lines of interest" LOI, aligned with the direction of variation of bias, as shown. The manner of processing the intensity information to obtain overlay measurements will be described later. First, various possible implementations of the continuous-bias targets will be illustrated.

Referring further to sub-targets 632 to 635, the gratings forming each of these targets may have different pitches. Sub-target 632 may have a bottom grating with pitch pb632 and may have a top grating with pitch pt632. In a similar manner, sub-target 634 may have a bottom grating with a pitch pb634 and top grating with pitch pt634. These targets, when illumination with radiation within a metrology tool such as the tool depicted in FIG. 3, would provide on the detection sensor of the tool in FIG. 3 a Moire pattern. In this case, the overlay is extracted as from the shift of the phase of the ensuing Moire interference pattern.

A problem with the current Moire metrology is the pollution of the signal containing the parameter of interest, such as overlay, with signals originating from imperfect gratings of the metrology targets, imperfections which are due to the processing of the semiconductor wafers. Such problems are known as grating asymmetry related nuisances. Due to the processing effects mentioned above, the signals from sub-targets 632 and 634 would differ, provided that the top and bottom pitches in these targets are the same. Furthermore, due to various paths the light may travel though the stack while reflecting and diffracting from the grating (parallax effects), further nuisance is added to the measured signal. The most dominant paths that lead to the overlay signal is the interference between the direct diffraction of the top grating and the path where light is transmitted in $0^{th}$ order through the top grating, diffracts in reflection and Pt order from the bottom grating and finally transmits in $0^{th}$ order through the top grating. Since the diffraction angle from 632 and 634 after diffraction from the bottom grating is different also the parallax effects will be different.

An object of the current invention is to provide a more robust overlay measurement in view of the aforementioned nuisances. A target design comprises gratings with at least 3 different pitches would solve the problems mentioned. In an embodiment, the pitch of the bottom grating is the same in sub-targets 632 and 634. Further, sub-target 632 has a top grating with pitch p1. Further, sub-target 634 has a top grating with pitch p2.

Sub-target 632 would create a Moiré pitch abs(P0*P1/(P0−P1))

$$P_M = \frac{P0 * P1}{|P0 - P1|}$$

The corresponding situation for sub-target 634 would also yield a similar Moiré pitch, with the difference that p1 is replaced by p2.

$$\frac{P0 * P1}{|P0 - P1|} = \frac{P0 * P2}{|P0 - P2|}$$

Hence for P2<>P1 the solution is $$P2 = \frac{P1 * P0}{(2 * P1 - P0)}$$

Therefore, with this triple-pitch design the overlay extraction will not be influenced at all—the only modification is that the overlay proportionality between phase and overlay is now only linearly dependent on the bottom pitch P0.

A further problem with the current Moire metrology is due to the fact that the scattering of light is conditioned by the ratio between the pitch of the grating, which a part of the metrology target, and the wavelength of the light. As known in the art, the choice of pitch of the scattering grating and the wavelength of the light used in the metrology tool allows the detection of specific orders, for example the first order of the diffracted light, whilst assuring at the same time that the other orders are not present on the sensor of the metrology tool.

A problem of the state of the art is caused by the scarcity of available pitches and wavelengths. It is an aim of the present invention therefore to provide a method to increase the choices of pitches and wavelengths, allowing in this manner a more robust and accurate metrology of a parameter of interest of a lithographic or etching process, for example overlay.

A Moire fringe is formed when a metrology target is illuminated with light, the metrology target comprising a bottom grating with pitch Pb and top grating with pitch Pt. The light scattered from these gratings interferes and forms Moire fringes on a sensor. A parameter of interest of the lithographic or etching process, such as overlay, is further obtained from the phase of said Moire fringe, in an example.

In an embodiment it is described the formation of Moire fringes wherein multiple scattered orders are used. For example, the wavelength is chosen such that generates n orders for bottom grating with pitch Pb and m orders for top grating with pitch Pt. These pair of orders generates accordingly Moire fringes according to:

$$P_{Moire}^{n,m} = \frac{P_b/n * P_t/m}{|P_b/n - P_t/m|} = \frac{P_b * P_t}{|P_b * m - P_t * n|}$$

wherein $P_{Moire}^{n,m}$ is the Moire pitch. In this manner, all the combination of propagating scattered orders n and m are included in a separate Moire pitch. Further Fourier analysis of the combined signal allows extraction of individual pair contributions. A target design comprises a grating with a Moire pitch as defined above. A method comprises illuminating a target having a Moire pitch with radiation. The method further comprises a Fourier analysis of the scattered signal to extract the contribution for individual pairs of orders. A further method comprises measuring the overlay for a wavelength for different order pairs and repeating the measurement of overlay for different order pairs for a different wavelength until a threshold is reached, wherein the threshold indicates which wavelength provides the least variation in the overlay measured for different order pairs.

The state of the art of metrology targets and the associated metrology methods is preponderantly based on targets having grating with equal pitches. In view of process induces variations, various metrology methods are known wherein accuracy of the overlay measurement is assured by complex multiple-wavelength measurements, or target designs. A further parameter which is used in equal pitch metrology methods is a bias between the position of the top and bottom gratings, and state of the art distinguishes single bias, multiple bias, or continuous biased targets.

A further problem with the use of multiple/continuous biased targets is that a large area on the wafer is needed in order to accommodate the multitude of biases.

It is yet another aim of the present invention to propose a method to combine single bias and multiple biased/continuous biased targets measurements or to correct the overlay measured with a single bias target employing information obtained from a multi-biased/continuous target, in order to reduce the area necessary for said targets and to improve overlay accuracy and robustness. In an embodiment, a few multiple/continuous biased targets are used to calibrate the overlay measurement of the multiple and smaller single bias targets.

Below equations describe the intensity measured on single biased targets, equations which allow measurement of overlay:

$$I_{NBN} = A^2 + B^2 + 2AB \cos\left(+(\varphi - b) - \frac{q}{\lambda}\right)$$

$$I_{NBC} = A^2 + B^2 + 2AB \cos\left(-(\varphi - b) - \frac{q}{\lambda}\right)$$

$$I_{PBN} = A^2 + B^2 + 2AB \cos\left(+(\varphi + b) - \frac{q}{\lambda}\right)$$

$$I_{PBC} = A^2 + B^2 + 2AB \cos\left(-(\varphi + b) - \frac{q}{\lambda}\right)$$

$$\varphi = 2\pi \frac{d^t - d^b}{p} = 2\pi \frac{OV}{p}$$

Here the A and B parameters are related to the diffraction efficiency of the gratings, phi is the overlay phase, b is the bias, q is the optical path length, and lambda is the wavelength of the light. A, B and q are all dependent on the wavelength, in ways that are very stack-dependent. When combining measurements of several wavelengths yielding the equations above, if A B and q vary in unexpected ways, one cannot do a good combined fit to the data to extract overlay. If, however, one uses a multi-bias target (while in theory 2 biases should suffice if there was no noise and perfect imaging, but in practice 4 or 8 biases are needed), we may completely fit the above equations and extract the A, B and q parameters per wavelength. This we would then feed as prior knowledge into the overlay estimation of the regular single bias targets, which could thus handle more non-ideal stacks.

Below equations describe the intensity measured on continuous biased targets:

$$I_{nL} = A^2 + B^2 + 2AB \cos\left(+(\varphi^L - Kx) - \frac{q_L}{\lambda}\right)$$

$$I_{cL} = A^2 + B^2 + 2AB \cos\left(-(\varphi^L - Kx) - \frac{q_L}{\lambda}\right)$$

$$I_{nR} = A^2 + B^2 + 2AB \cos\left(+(\varphi^R + Kx) - \frac{q_R}{\lambda}\right)$$

$$I_{cR} = A^2 + B^2 + 2AB \cos\left(-(\varphi^R + Kx) - \frac{q_R}{\lambda}\right)$$

Here we see the same A and B parameters, and slightly different q parameters (which are analytically related to the q in the previous equations in a known way). By looking at the amplitude of these fringes, the cosine term drops out, and we can, for any wavelength, recover A and B. By observing the phase shift through wavelength, one can estimate q as a function of wavelength as well. Assuming that these parameters don't change drastically between continuous-bias targets and single bias targets (assured by similar target design), one may use the known parameters of fitting overlay for single biased targets, greatly improving the accuracy of determining overlay for difficult layers, with very wavelength-dependent stack response.

A further advantage of using multi-biased/continuous targets, despite the fact that take more space and sample the sinusoidal functions less densely, is that they are less affected by from camera noise, and optical aberrations.

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' A used herein do not require that the structure has been provided specifically for the measurement being performed. Further, pitch P of the metrology targets is close to the resolution limit of the optical system of the scatterometer, but may be much larger than the dimension of typical product features made by lithographic process in the target portions C. In practice the lines and/or spaces of the overlay gratings within the targets may be made to include smaller structures similar in dimension to the product features.

In association with the physical grating structures of the targets A realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the steps S1-S6 and so calculate overlay error.

The program may optionally be arranged to control the optical system, substrate support and the like to perform the steps S1-S6 for measurement of asymmetry on a suitable plurality of targets.

Figure 8:
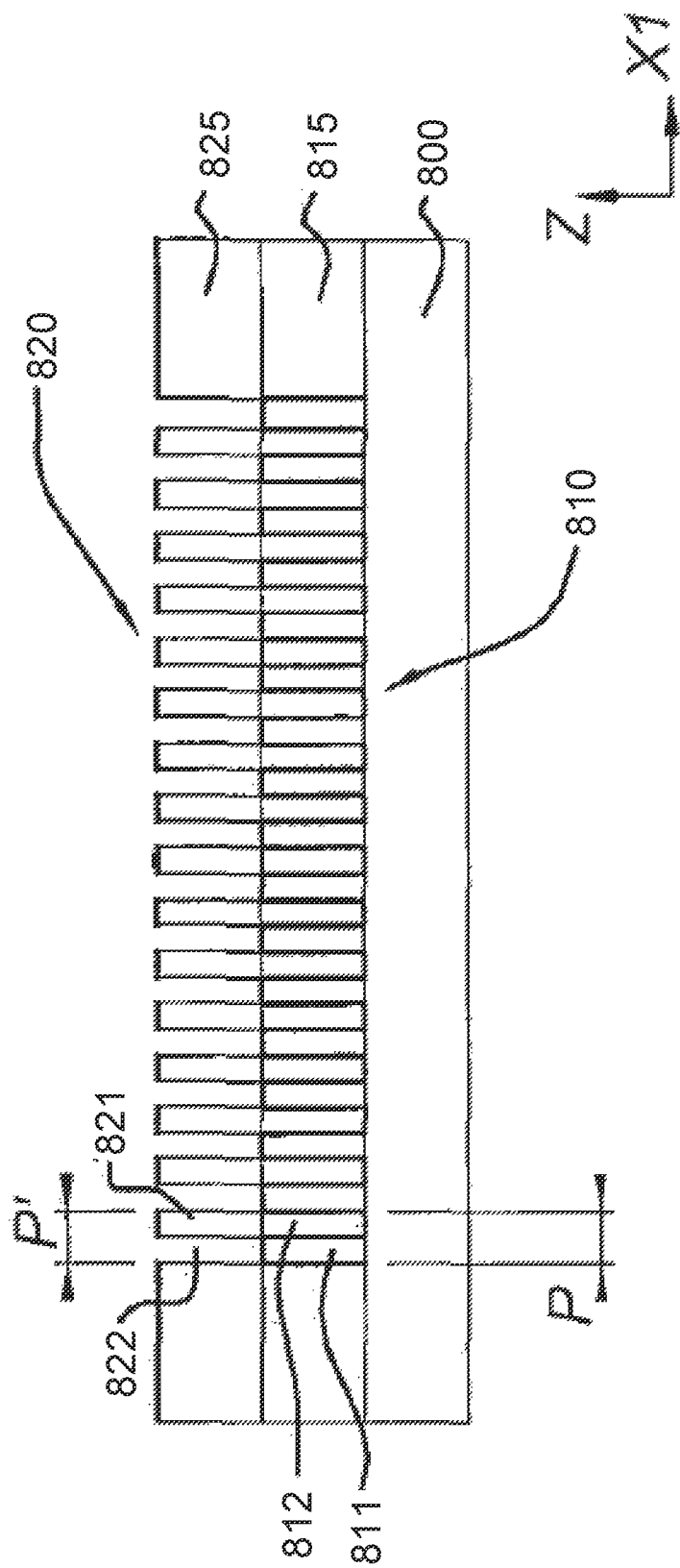
FIG. 8 depicts a cross-section of a composite grating, according to some embodiments.

FIG. 8 shows a cross-section of a composite grating that exhibits a zero overlay error, according to some embodiments. In some embodiments, the composite grating can be constructed on a substrate 800, wherein the composite grating includes a first grating 810 and a second grating 820.

In some embodiments, the first grating 810 can be patterned in the substrate material and can include a first periodic structure along a grating direction X1. In some embodiments, the periodic structure of first grating 810 can include a plurality of primary lines 811 with secondary lines 812 interposed. The periodic structure can be formed in layer 815. For clarity, only one primary line 811 and one adjacent secondary line 812 have been indicated by reference numbers in FIG. 8. The pitch P of the grating 810 can be equal to the width of one primary line 811 and one secondary line 812. As will be appreciated by those skilled in the art, the secondary lines 812 may be created from trenches in between the primary lines 811 that are filled by a material different from the substrate material. For example, the substrate material can be silicon and the trench material can be a dielectric like silicon dioxide, or a metal like tungsten or copper.

In some embodiments, a second grating 820 can be on top of the first grating 810. The second grating 820 can consist of a second periodic structure. In the embodiment shown in FIG. 8, the second periodic structure can include a plurality of lines 821 with trenches 822 interposed along the grating direction X1. In this example, lines 821 can be positioned on top of the secondary lines 812 of the first grating 810. The second grating 820 has a pitch P' in direction X1 equal to the width of one line 821 and one trench 822. The pitch P' of the second grating 820 is chosen to be substantially equal to the pitch P of the first grating 810. In an embodiment, lines 821 of the second grating 820 may have substantially the same width as the secondary lines 812 of the first grating 810. Alternatively, lines 821 of the second grating 820 may be located on top of the primary lines 811 of the first grating 810. The second grating may be a pattern formed in a resist layer 825.

In the embodiment shown in FIG. 8, the alignment of the first and second gratings 810 and 820 can be perfect such that the mismatch is ideally zero (which will be referred to as a zero overlay error). The lines 821 of the second grating 820 can be aligned fully with the secondary lines 812 of the first grating 810.

Further embodiments according to the invention are described in below numbered clauses:

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), A well A particle beams, such A ion beams or electron beams.

The term "lens", where the context allows, may refer to any one or combination of various types of components, including refractive, reflective, magnetic, electromagnetic and electrostatic components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A target for determining a performance parameter of a lithographic process, the target comprising:
a first sub-target formed by at least two overlapping gratings, wherein an underlying grating of the first sub-target has a first pitch $P_{b1}$ and a top lying grating of the first sub-target has a second pitch $P_{t1}$,
wherein a predetermined wavelength generates n scattered orders for the underlying grating of the first sub-target and m scattered orders for the top lying grating of the first sub-target such that the n scattered orders and the m scattered orders generate a Moire pitch according to $$P_{Moire}^{n,m} = \frac{P_{b1} * P_{t1}}{|P_{b1} * m - P_{t1} * n|}$$

and
at least a second sub-target formed by at least two overlapping gratings, wherein an underlying grating of the second sub-target has a third pitch $P_{b2}$ and a top lying grating of the second sub-target has a fourth pitch $P_{t2}$,
wherein a predetermined wavelength generates n scattered orders for the underlying grating of the second sub-target and m scattered orders for the top lying grating of the second sub-target such that the n scattered orders and the m scattered orders generate a Moire pitch according to $$P_{Moire}^{n,m} = \frac{P_{b2} * P_{t2}}{|P_{b2} * m - P_{t2} * n|}$$

and
wherein the first pitch $P_{b1}$ and the third pitch $P_{b2}$ comprise a same bottom pitch $P_0$, which produces an overlay proportionality between a phase and an overlay that is linearly dependent on the bottom pitch $P_0$ according to $$P_{t2} = \frac{P_{t1} * P_0}{(2 * P_{t1} - P_0)}$$

2. The target of claim 1, wherein the target is formed on a substrate, the substrate comprising a surface in an X-Y plane.

3. The target of claim 2, wherein the first and second sub-targets have a same X and Y dimension.

4. The target of claim 1, wherein the target further comprises:
a third sub-target formed by at least two overlapping gratings, wherein an underlying grating of the third sub-target has the first pitch $P_{b1}$ and a top lying grating of the third sub-target has the second pitch $P_{t1}$,
wherein a predetermined wavelength generates n scattered orders for the underlying grating of the third sub-target and m scattered orders for the top lying grating of the third sub-target such that the n scattered orders and the m scattered orders generate a Moire pitch according to $$P_{Moire}^{n,m} = \frac{P_{b1} * P_{t1}}{|P_{b1} * m - P_{t1} * n|}$$

and
a fourth sub-target formed by at least two overlapping gratings, wherein an underlying grating of the fourth sub-target has the third pitch $P_{b2}$ and a top lying grating of the fourth sub-target has the fourth pitch $Pt_2$,
wherein a predetermined wavelength generates n scattered orders for the underlying grating of the fourth sub-target and m scattered orders for the top lying grating of the fourth sub-target such that the n scattered orders and the m scattered orders generate a Moire pitch according to $$P_{Moire}^{n,m} = \frac{P_{b2} * P_{t2}}{|P_{b2} * m - P_{t2} * n|}$$

5. The target of claim 4, wherein the target is formed on a substrate, the substrate comprising a surface in an X-Y plane, and wherein the first, second, third and fourth sub-targets each have a same X and Y dimension.

6. The target of claim 4, wherein the third sub-target and the first sub-target have an overlay bias that increases in a first direction, and the second sub-target and the fourth sub-target have an overlay bias that decreases in the first direction.

7. The target of claim 6, wherein the increasing overlay bias has a continuous variation having fitting overlay parameters that calibrate overlay measurements of one or more single bias targets.

8. The target of claim 6, wherein the decreasing overlay bias has a continuous variation having fitting overlay parameters that calibrate overlay measurements of one or more single bias targets.

9. A method of making a target for determining a performance parameter of a lithographic process, comprising:
forming a first sub-target having at least two overlapping gratings, wherein an underlying grating of the first sub-target has a first pitch $P_{b1}$ and a top lying grating of the first sub-target has a second pitch $P_{t1}$,
wherein a predetermined wavelength generates n scattered orders for the underlying grating of the first sub-target and m scattered orders for the top lying grating of the first sub-target such that the n scattered orders and the m scattered orders generate a Moire pitch according to $$P_{Moire}^{n,m} = \frac{P_{b1} * P_{t1}}{|P_{b1} * m - P_{t1} * n|}$$

forming at least a second sub-target having at least two overlapping gratings, wherein an underlying grating of the second sub-target has a third pitch $P_{b2}$ and a top lying grating of the second sub-target has a fourth pitch $P_{t2}$,
wherein a predetermined wavelength generates n scattered orders for the underlying grating of the second sub-target and m scattered orders for the top lying grating of the second sub-target such that the n scattered orders and the m scattered orders generate a Moire pitch according to $$P_{Moire}^{n,m} = \frac{P_{b2} * P_{t2}}{|P_{b2} * m - P_{t2} * n|};$$

and
forming the first pitch $P_{b1}$ and the third pitch $P_{b2}$ with a same bottom pitch $P_0$, which produces an overlay proportionality between a phase and an overlay that is linearly dependent on the bottom pitch $P_0$ according to $$P_{t2} = \frac{P_{t1} * P_0}{(2 * P_{t1} - P_0)}$$

10. The method of claim 9, further comprising forming the target on a substrate, the substrate comprising a surface in an X-Y plane.

11. The method of claim 10, further comprising forming the first and second sub-targets with a same X and Y dimension.

12. The method of claim 9, further comprising:
forming a third sub-target having at least two overlapping gratings, wherein an underlying grating of the third sub-target has the first pitch $P_{b1}$ and a top lying grating of the third sub-target has the second pitch $P_{t1}$,
wherein a predetermined wavelength generates n scattered orders for the underlying grating of the third sub-target and m scattered orders for the top lying grating of the third sub-target such that the n scattered orders and the m scattered orders generate a Moire pitch according to $$P_{Moire}^{n,m} = \frac{P_{b1} * P_{t1}}{|P_{b1} * m - P_{t1} * n|};$$

and
forming a fourth sub-target having at least two overlapping gratings, wherein an underlying grating of the fourth sub-target has the third pitch $P_{b2}$ and a top lying grating of the fourth sub-target has the fourth pitch $P_{t2}$,
wherein a predetermined wavelength generates n scattered orders for the underlying grating of the fourth sub-target and m scattered orders for the top lying grating of the fourth sub-target such that the n scattered orders and the m scattered orders generate a Moire pitch according to $$P_{Moire}^{n,m} = \frac{P_{b2} * P_{t2}}{|P_{b2} * m - P_{t2} * n|}.$$

13. The method of claim 12, further comprising forming the target on a substrate, the substrate comprising a surface in an X-Y plane, and further comprising forming the first, second, third and fourth sub-targets with a same X and Y dimension.

14. The method of claim 12, further comprising forming the third sub-target and the first sub-target with an overlay bias that increases in a first direction, and the second sub-target and the fourth sub-target with an overlay bias that decreases in the first direction.

15. The method of claim 14, further comprising forming the increasing overlay bias with a continuous variation having fitting overlay parameters that calibrate overlay measurements of one or more single bias targets.

16. The method of claim 14, further comprising forming the decreasing overlay bias with a continuous variation having fitting overlay parameters that calibrate overlay measurements of one or more single bias targets.

* * * * *

UNITED STATES PATENT AND TRADEMARK OFFICE
CERTIFICATE OF CORRECTION

PATENT NO. : 12,019,377 B2
APPLICATION NO. : 17/299531
DATED : June 25, 2024
INVENTOR(S) : Van Der Schaar et al.

It is certified that error appears in the above-identified patent and that said Letters Patent is hereby corrected as shown below:

In the Specification

In Column 3, Line 27, after "3(a)-3(b);" insert -- and --.

In Column 8, Line 45, delete "(d)." and insert -- 3(d). --, therefor.

In Column 11, Line 32, delete "Pt" and insert -- 1$^{st}$ --, therefor.

In the Claims

In Column 16, Claim 1, Line 15, delete "$\frac{P_{b1} * P_{t1}}{|P_{b1} * m - P_{t1} * n|}$" and insert -- $\frac{P_{b1}*P_{t1}}{|P_{b1}*m-P_{t1}*n|}$ --, therefor.

In Column 16, Claim 1, Line 31, delete "$\frac{P_{b2} * P_{t2}}{|P_{b2} * m - P_{t2} * n|}$" and insert -- $\frac{P_{b2}*P_{t2}}{|P_{b2}*m-P_{t2}*n|}$ --, therefor.

In Column 16, Claim 1, Line 41, delete "$\frac{P_{t1} * P_0}{(2 * P_{t1} - P_0)}$" and insert -- $\frac{P_{t1}*P_0}{(2*P_{t1}-P_0)}$ --, therefor.

In Column 16, Claim 4, Line 65, delete "$\frac{P_{b1} * P_{t1}}{|P_{b1} * m - P_{t1} * n|}$" and insert -- $\frac{P_{b1}*P_{t1}}{|P_{b1}*m-P_{t1}*n|}$ --, therefor.

In Column 17, Claim 4, Line 5, delete "Pt$_2$" and insert -- P$_{t2}$, --, therefor.

In Column 17, Claim 4, Line 15, delete "$\frac{P_{b2} * P_{t2}}{|P_{b2} * m - P_{t2} * n|}$" and insert -- $\frac{P_{b2}*P_{t2}}{|P_{b2}*m-P_{t2}*n|}$ --, therefor.

Signed and Sealed this
Seventh Day of October, 2025

John A. Squires
*Director of the United States Patent and Trademark Office*

CERTIFICATE OF CORRECTION (continued)
U.S. Pat. No. 12,019,377 B2

In Column 17, Claim 9, Line 49, delete "$\frac{P_{b1}*P_{t1}}{|P_{b1}*m-P_{t1}*n|}$" and insert --$\frac{P_{b1}*P_{t1}}{|P_{b1}*m-P_{t1}*n|}$--, therefor.

In Column 18, Claim 9, Line 9, delete "$\frac{P_{t1}*P_0}{(2*P_{t1}-P_0)}$" and insert --$\frac{P_{t1}*P_0}{(2*P_{t1}-P_0)}$--, therefor.